United States Patent [19]
Hagen et al.

[11] Patent Number: 6,003,223
[45] Date of Patent: Dec. 21, 1999

[54] COMMON ALIGNMENT TARGET IMAGE FIELD STITCHING METHOD FOR STEP AND REPEAT ALIGNMENT IN PHOTORESIST

[75] Inventors: Jeffrey Paul Hagen; Cherng-Chyi Han, both of San Jose; Jackie A. Franklin, Milpitas, all of Calif.

[73] Assignee: Headway Technologies, Inc., Milpitas, Calif.

[21] Appl. No.: 09/195,650

[22] Filed: Nov. 19, 1998

[51] Int. Cl.$^6$ .................................................. G11B 5/42
[52] U.S. Cl. ........................... 29/603.12; 430/22; 451/31
[58] Field of Search ................... 29/603.12; 451/29–31; 430/22

[56] References Cited

U.S. PATENT DOCUMENTS

| | | | |
|---|---|---|---|
| 4,823,012 | 4/1989 | Kosugi | 250/491.1 |
| 4,982,227 | 1/1991 | Suzuki | 355/53 |
| 5,250,983 | 10/1993 | Yamamura | 355/125 |
| 5,695,897 | 12/1997 | Mitome et al. | 430/22 |
| 5,716,889 | 2/1998 | Tsuji et al. | 438/401 |
| 5,733,690 | 3/1998 | Jeong et al. | 430/5 |

*Primary Examiner*—Carl E. Hall
*Attorney, Agent, or Firm*—George O. Saile; Stephen B. Ackerman; William J. Stoffel

[57] ABSTRACT

A method of for aligning step and repeat reticle images for 2 adjacent sliders for magnetoresistive (MR) devices. The invention forms 3 wafer alignment targets for two adjacent sliders. The 3 wafer alignment targets are used to align adjacent reticle exposure fields. An novel common alignment target is between the two sliders. The stepper alignment system uses the wafer alignment target placed in the field stitch area between two adjacent fields and the alignment target for that particular field to align the reticle. The method includes: forming (1) a first wafer alignment target in the first slider area; (2) a second wafer alignment target in the second slider area; and (3) a center wafer alignment target between the first and the second wafer alignment targets. Using a stepper, exposing the first slider area with the reticle image field. The first reticle image field having spaced first and second reticle alignment keys. The first alignment key is aligned with the first wafer alignment target and the second reticle alignment key is aligned with the center alignment target. Next, stepping and exposing the second slider area with a second reticle image field by aligning a first reticle alignment key with the center wafer alignment target and aligning the second reticle alignment key of the second reticle image field with the second wafer alignment target.

8 Claims, 5 Drawing Sheets

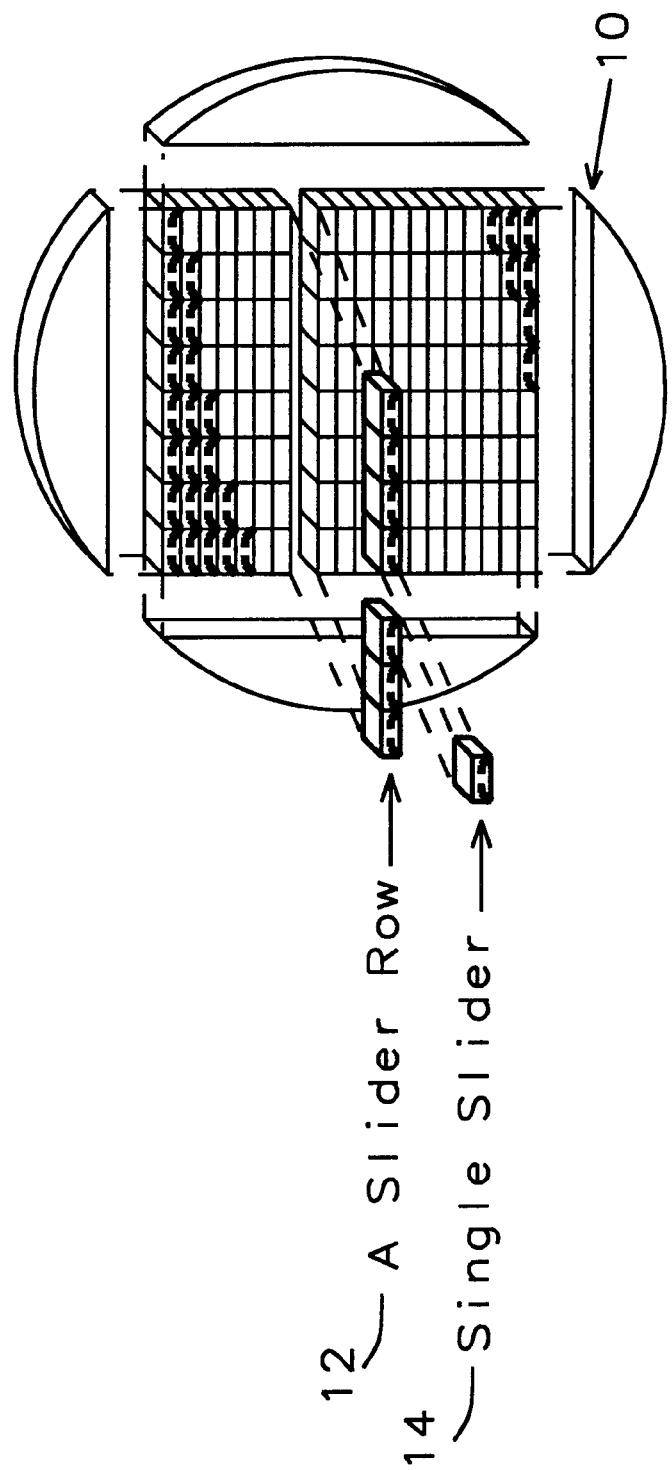
FIG. 1 – Prior Art

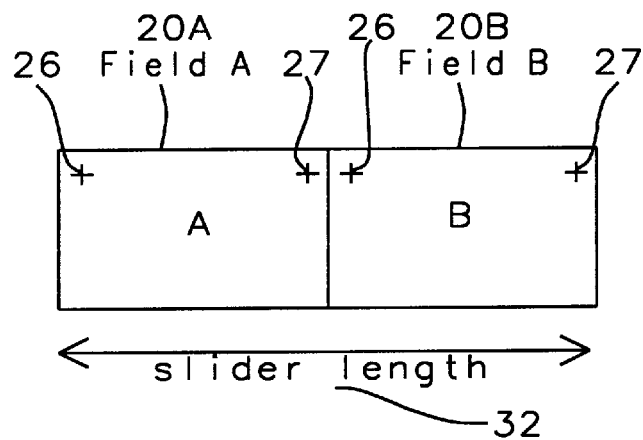
FIG. 2A – Prior Art
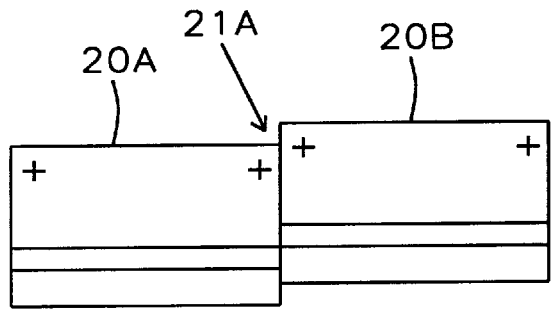
FIG. 2B – Prior Art
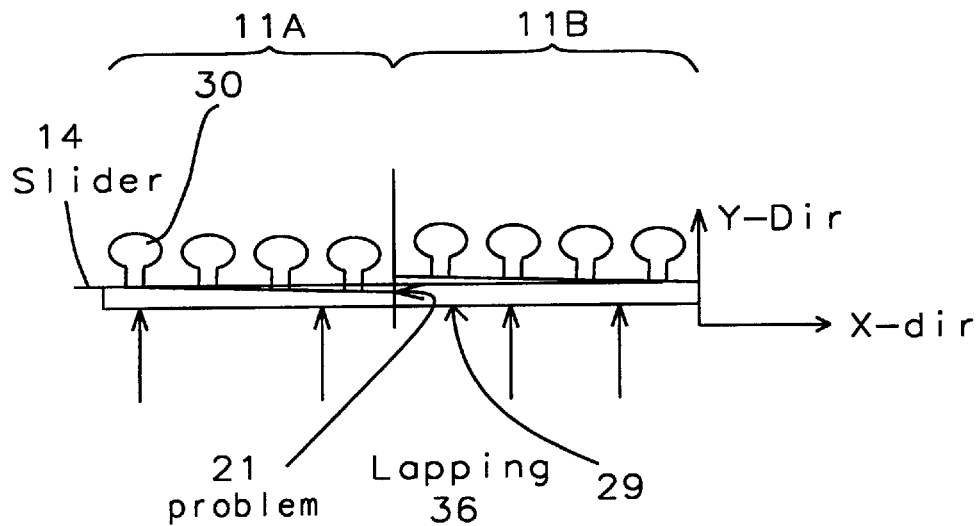
FIG. 3 – Prior Art

COMMON ALIGNMENT TARGET IMAGE FIELD STITCHING METHOD FOR STEP AND REPEAT ALIGNMENT IN PHOTORESIST

BACKGROUND OF THE INVENTION

1) Field of the Invention

This invention relates generally to fabrication of magnetoresistive (MR) heads, and more particularly a method to align a step and repeat exposure tool (reticles) on sliders for MR heads and more particularly to a step and repeat exposure process using three wafer alignment marks for two adjacent exposure fields.

2) Description of the Prior Art

Thin film head magnetoresistive (MR) elements are printed using a step and repeat system in rows that eventually require the magnetoresistive (MR) stripe on all devices in the two inch row (equivalent to two adjacent stepper flash fields) be lapped simultaneously to a specific height. The inventors have found inaccuracies in the stepper stage position (rotation and shift from expected position) when stepping the adjacent image fields creates a step function within the row bar. The devices along the two inch row bar should "line up" perfectly to allow optimum lapping conditions. The step function at the row center causes yield fallout due to poor magnetoresistive (MR) resistance because the lapping process cannot accommodate the step perfectly. The step function error has been typically measured by the inventors as 130 nm one sigma when aligning the image fields at the stepper using conventional independent alignment targets.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 4,823,012(Kosugi) shows a step and repeat system having alignment marks provided in association with neighboring fields on the wafer which are to be exposed to the reticle pattern in sequence.

U.S. Pat. No. 5,695,897(Mitome et al.) shows an alignment method where two steppers have different reduction magnification is used to perform a global alignment and a smaller field alignment.

U.S. Pat. No. 5,716,889(Tsuji et al.) and U.S. Pat. No. 5,250,983(Yamamura) show alignment marks in the kerf between dies.

U.S. Pat. No. 5,733,690(Jeong et al.) shows two sets of alignment marks formed on the scribe line to measure overlay.

U.S. Pat. No. 4,982,227(Suzuki) shows a method for alignment using multiple alignment modes by adapting an alignment method by a sample alignment prior to the exposure operation. The alignment modes examines multiple sized fields.

SUMMARY OF THE INVENTION

It is an object of the present invention to provide a method for fabricating a slider bar for a magnetoresistive (MR) device that has a constant throat height.

It is an object of the present invention to provide a method for fabricating a slider bar for a magnetoresistive (MR) device using a step and repeat system with a common alignment target 42 for two sliders 12A 12B on a wafer to align 2 stepper exposure fields.

It is an object of the invention to provide a method to align a step and repeat exposure tool on sliders.

It is an object of the invention to provide a method to align a step and repeat exposure tool using 3 wafer alignment marks for 2 adjacent fields.

To accomplish the above objectives, the present invention teaches a method of forming 3 wafer alignment targets 40 42 44 for two sliders (e.g., slider areas 12A 12B). The 3 wafer alignment targets are used to align adjacent reticle exposure fields 20A 20B (See FIGS. 5A & 5B). A novel common alignment target 42 is placed between the two sliders 12A 12B. The common alignment target is placed in the field stitch area 28 between two adjacent fields 28A 28B. See FIGS. 6A & 6B. The stepper alignment system uses the wafer alignment target 42 placed in the field stitch area between two adjacent fields and the alignment target for that particular field to align the reticle. A key point of the invention is that the same center alignment mark 42 is used to align two adjacent reticle fields. The invention's alignment process can be used to align any photoresist patterns at any level to form devices on the substrate.

In slightly more detail, the method includes: forming (1) a first wafer alignment target 40 in the first slider area; (2) a second wafer alignment target 44 in the second slider area; and (3) a center wafer alignment target 42 between the first and the second wafer alignment targets. Using a stepper, exposing the first slider area 12A with the reticle image field 70A. The first reticle image field 70A having spaced first and second reticle alignment keys 72A 74A. The first alignment key is aligned with the first wafer alignment target 40 and the second reticle alignment key 74 is aligned with the center alignment target 42. Next, stepping and exposing the second slider area 12B with a second reticle image field 70B by aligning a first reticle alignment key 72B with the center wafer alignment target 42 and aligning the second reticle alignment key 74B of the second reticle image field with the second wafer alignment target 44.

Benefits

Yield loss due to magnetoresistive (MR) stripe resistance variation at the stepper image field stitch area approaches 5–8% due to image field stitch error. The row lap process can compensate for smooth transitions at the image field stitch area that resemble concave or convex form but does poorly at compensating for step functions. This 5–8% yield loss can be recovered using the invention's common alignment target align method by reducing the step function from 390 nm three sigma (process capability for standard independent alignment target method) to less than 100 nm three sigma.

The present invention achieves these benefits in the context of known process technology. However, a further understanding of the nature and advantages of the present invention may be realized by reference to the latter portions of the specification and attached drawings.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a three dimensional view of a wafer 10 showing a row of sliders 12 cut out and a single slider 14 cut out from this row 12 according to the prior art.

FIG. 2A shows a top down view of a standard Ultratech alignment layout for two adjacent fields 20A 20B according to the prior art.

FIG. 2B shows a top down view of an Ultratech alignment layout for a stepper where stage accuracy causes an error in adjacent field placement according to the prior art.

FIG. 3 is side view of a side row with misaligned fields being lapped according to the prior art.

DETAILED DESCRIPTION OF THE PREFERRED EMBODIMENTS

The present invention will be described in detail with reference to the accompanying drawings. In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

MAJOR STEPS OF THE INVENTION

Figure 5A:
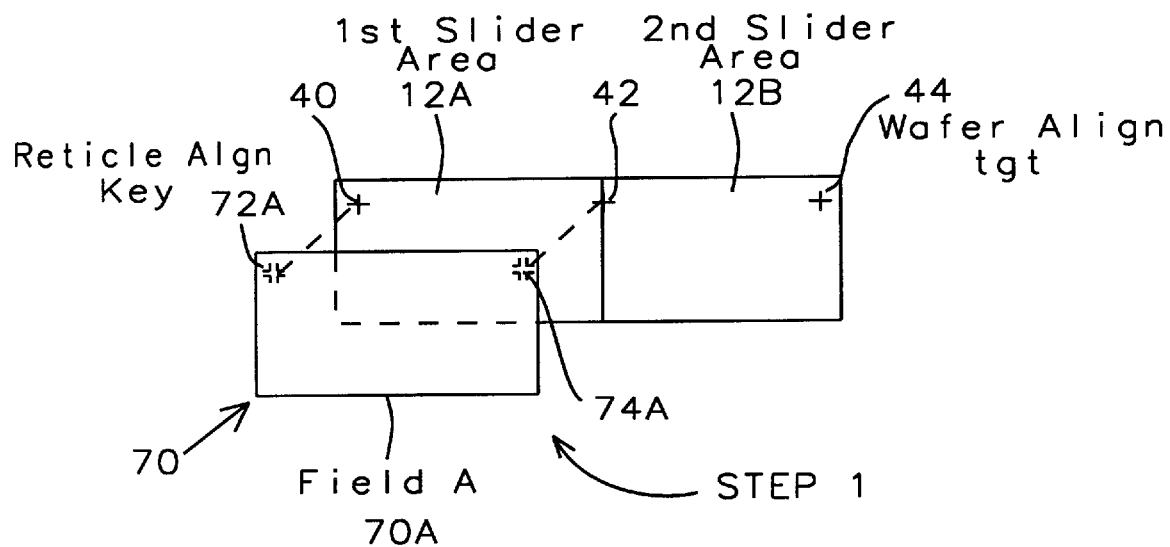
FIG 5A is a top down view of the invention's 3 wafer alignment targets 40 42 44 on 2 sliders 12A 12B on a wafer; and a first field reticle 70A showing the alignment of the reticle alignment key 72 o the wafer alignment marks 40 42 for the first exposure according to the process of the present invention.
Figure 5B:
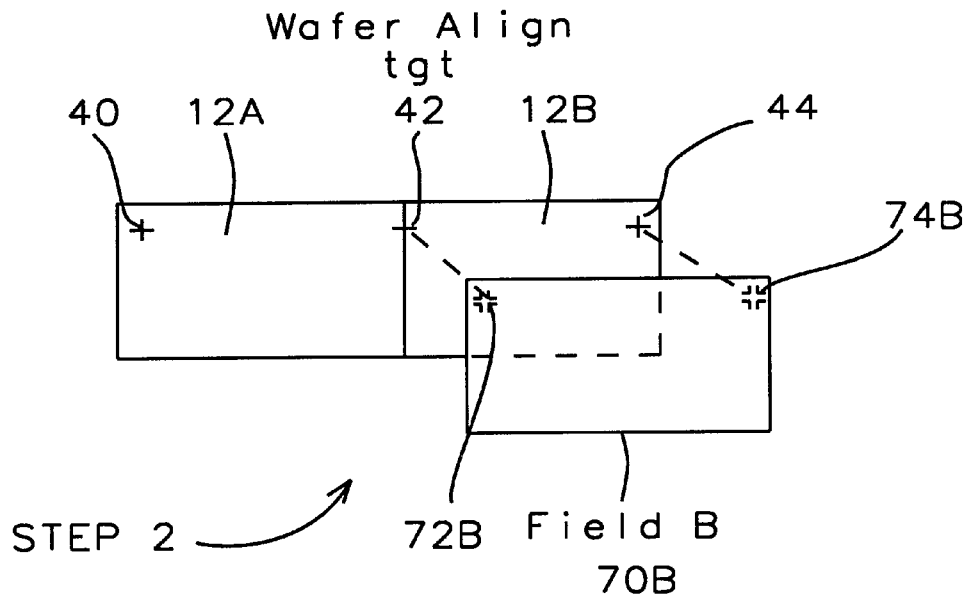
FIG. 5B is a top down view of the invention's 3 wafer alignment targets 40 42 44 showing the stepping of the reticle and $2^{nd}$ exposure of the reticle (second field 70B) according to the process of the present invention.
Figure 8:
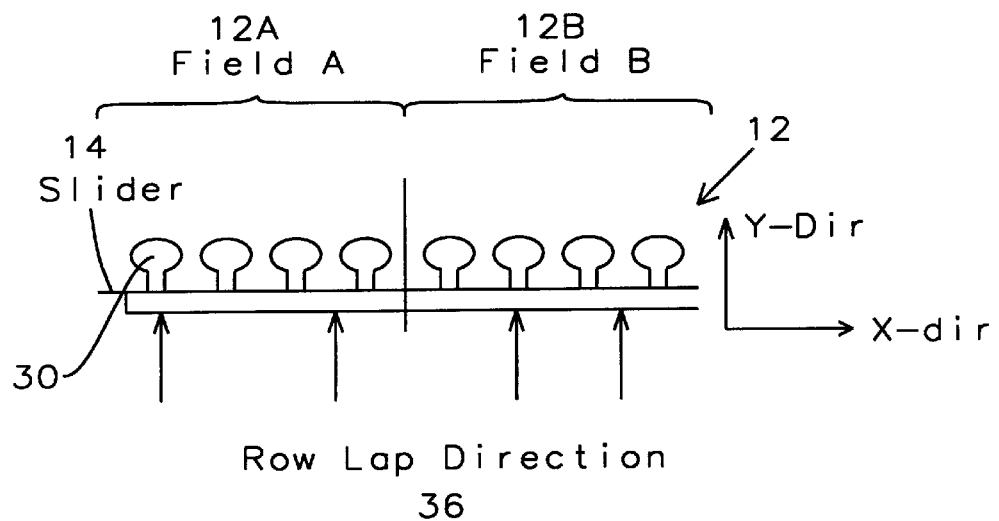
FIG. 8 is a side view in cut away cross section of a slider bar being lapped showing the improved even surface of the adjacent sliders 12A 12B made by the invention's three alignment target and step and repeat process.

The invention's method of making a magnetoresistive (MR) head using a step and repeat exposure tool; includes:
1. As shown in FIG. 1, we provide a substrate having a slider row 12 comprised of sliders 14. The slider row has a first slider area 12A and a second slider area 12B. The first slider area is adjacent to the second slider area.
2. Referring to FIG. 5A, we form (1) a first wafer alignment target 40 in the first slider area 12A on the substrate; (2) a second wafer alignment target 44 in the second slider area; and (3) a novel center wafer alignment target 42 between the first and the second wafer alignment targets.
3. Next, we form a photoresist layer (not shown) over the substrate.
4. FIG. 5A shows using a stepper, exposing through a stepper aperture the first slider area 12A with a first reticle image field 70A. The first reticle image field 70A has spaced first and second reticle alignment keys 72A 74A. The first alignment key 72A is aligned with the first wafer alignment target 40 and the second reticle alignment key 74A is aligned with the center alignment target 42.
5. FIG. 5B shows stepping and exposing the second slider area 12B through the stepper aperture with a second reticle image field 70B. The second reticle image field 70B having spaced first and second alignment targets 72B 74B. The first reticle alignment key 72B is aligned with the center wafer alignment target 42 and the second reticle alignment key 74B is aligned with the second wafer alignment target 44.
6. FIG. 8 shows forming devices 30 in the first slider area 12A and the second slider area 12B.
7. We then cut the first and second slider areas 12A 12B into a slider row 12.
8. FIG. 8 shows lapping the slider row 12 whereby the center wafer alignment target allows better alignment of the first and second reticle image fields 70A 70B thereby allowing higher throat height accuracy. The invention's alignment process can be used to align any photoresist patterns at any level to form devices on the substrate.

Problems of the Prior Art—4 Alignment Targets for 2 Sliders

Prior art FIG. 1 shows a three dimensional view of a wafer 10 showing a row of sliders 12 cut out a single slider 14 cut out from this row 12. Each slider 14 preferably has 2 MR heads deposited on it. A slider row when cut for lapping comprises 2 slider areas (or sliders 12A, 12B). The two slider field areas are exposed by two reticle field areas 70A 70B. Therefore, it is important to accurately align the 2 reticle field areas (slider areas) so the lapping is proper. See FIG. 3

FIGS. 2A, 2B, and 3 show the problems of conventional step and repeat slider exposure processes.

FIG. 2A Shows a standard Ultratech alignment layout for two adjacent fields 20A 20B. Right and left key/target (+)26 are independent to the two fields A and B (20A) 20B. Stepper aligns field A 20A using the two targets 26 27 on the wafer. The stepper then moves the image field to the adjacent location (field B) on the wafer and uses the two targets 26 27 in the field position B to align the image field 20B in position B. The combined length of the two stepper image fields 20A 20B comprise one slider bar length 32.

Referring to FIG. 2B, stepper stage accuracy cause errors 21A in adjacent field placement as shown here exaggerated. Magnetoresistive (MR) devices are laid) out in the image fields 20A 20B in rows as indicated by the "bars", are printed on the wafer. The combined length of the two stepper image fields comprise one slider bar length. The error in field placement creates a step 21A (misalignment of the top and bottom field A & B edges) in the bar.

Figure 4A:
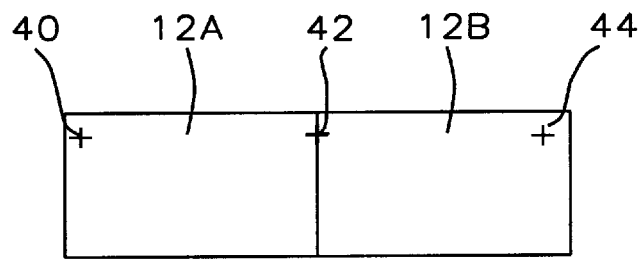
FIG. 4A is top down view of the inventions 3 wafer alignment mark 40 42 44 on a wafer system for aligning step and repeat fields across 2 adjacent fields (e.g., sliders) according to the method of the present invention.

Referring to FIG. 3, devices (shown enlarged) 30 within the slider bar are shown here with the exaggerated image field placement error in Y direction. FIG. 3 is a cross section view of the wafer and slider row. FIG. 3 shows adjacent first and second slider areas 11A 11B. First and second slider areas 11A 11B correspond the to area of the wafer exposed by field A 20A & Field B 20B. Lapping all devices to specified throat height is difficult due to the noncontinuous nature of the row of devices. All devices cannot be lapped to the same throat height due to Y-direction error 21 (problem). Devices near field boundary are lapped to different throat height than others as represented here. Lapping pad 29 shown in heavy print. Note lap pad orientation to inner and outer devices (overlapped and under-lapped). This problem 21 cause different throat heights in MR devices.
Invention's Common Wafer Alignment Target Scheme—FIG. 4A FIG. 4A shows a top down view of a portion of a wafer. FIG. 4A shows a top down view of the wafer 10 having a first and second slider areas 12A 12B. Slider areas 12A 12B are the areas of the wafer where sliders will be fabricated and cut from.

A key feature of the invention is the center wafer alignment target 42 that is between the first and second slider areas 12A 12B. The center wafer alignment target 42 is used by the stepper to align both the first and second slider areas 12A 12B. The distance 73 from the center (common) wafer alignment target 42 to the first and second wafer alignment targets 40 44 is about 24 mm and more preferably between 23.5 and 24.5 mm. This distance is maximized to allow for superior rotation control over narrow distances (less than 20 mm to 22 mm which is standard).

An important feature of the invention is the forming of three wafer alignment targets 40 42 44 for 2 slider areas 12A 12B. This is in contrast with the conventional method of forming two independent (right and left) wafer alignment targets 26 27 (see FIG. 2A) on the wafer for each slider area. The invention uses a center (common) wafer alignment target 42 between two adjacent sliders areas 12A 12B.

The first wafer alignment target 40 is preferably located in a first corner of the first slider area 12A away from the second slider area 12B; and the second wafer alignment target 44 is located is a second corner away from the first slider area 12A. The center wafer alignment target 42 has portions located on both first and second slider areas 12A 12B.

The wafer alignment targets are preferably formed by depositing a full film metal layer on the wafer. Photolithographic process is used to pattern the wafer with the target image. A dry metal etch is used to remove metal in all areas except under the photoresist. The resist is stripped leaving metal targets on the substrate.

An example of a stepper that can be used with the invention is stepper UST 2700 model, by Ultratech Company.
Reticle image fields 70A 70B

Figure 4B:
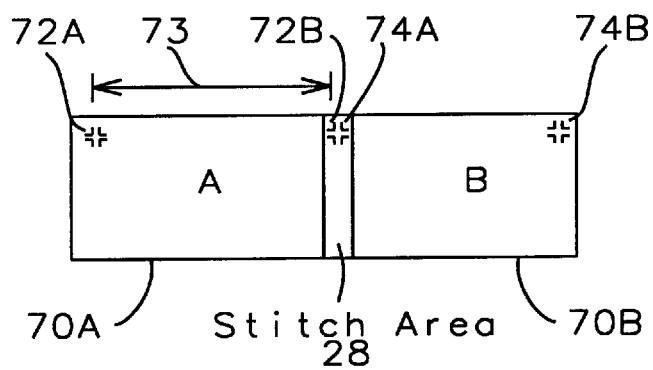
FIG. 4B is top down view of two reticle fields 70A 70B and stitch areas 28 of the invention's 3 wafer alignment mark 40 42 44 system for aligning step and repeat fields across 2 adjacent fields (e.g., sliders) according to the method of the present invention.

FIG. 4B shows two reticle image fields 70A 70B. The recticle fields overlap in the center. Reticle field 70A can be the same as reticle field 70B. That is the same reticle can be exposed to create both reticle image fields 70A 70B. Field 70A can be exposed, then stepped and then exposed again to create reticle field 70B. Alternately, Reticle field 70A can be another different reticle field (different pattern) than reticle field 70B. Reticules can contain up to 3 reticle fields.

The overlap between consecutive reticle field exposures is called the field stitch area 28. Reticle alignment targets (72 74) are used to precisely align the mask with the slider (i.e., wafer alignment targets). Top down view FIG. 4B shows the center reticle alignment key(s) 72A 74A in the stitch area 28. In actual practice, field A is exposed, the stepper steps the reticle and field B is exposed. See FIGS. 5A and 5B. FIG. 4B shows the overlay of field A and field B. The reticle alignment target in the center is the overlap of both targets 72B 74A from field A and field B. See FIGS. 5A and 5B.

The center alignment target 42 is used by the stepper to align both reticle image field A (70A) and image field B (70B). Between about 500 to 600 sliders are formed in image field A. Stage accuracy is eliminated as a parameter and the error contribution between the two image fields is reduced to alignment accuracy only.

Field A represents the first exposure of a reticle field and field B represents the next (or second step) exposure of a second reticle field. Reticules can contain up to 3 reticle fields. Second reticle field is match to the first (design wise).
Step and Repeat Process With Invention's Common Alignment mark 42

FIG. 5A (Step 1) shows using a stepper, exposing through a stepper aperture the first slider area 12A with the reticle image field 70A. The first reticle image field 70A having spaced first and second reticle alignment keys 72A 74A. The first and second wafer alignment targets 40 44 are spaced away from each other and the center wafer alignment target 42. Preferably, the first wafer alignment target 40 is toward the edge of the $1^{st}$ slider area and more preferably more than 75% of the length of the slider from the center alignment target. The $2^{nd}$ alignment target is place similarly with respect to the second Area 12B.

The first alignment key 72A is aligned with the first wafer alignment target 40 and the second reticle alignment key 74A is aligned with the center alignment target 42.

FIG. 5B (Step 2) shows stepping and exposing the second slider area 12B through the stepper aperture with the second reticle image field 70B by aligning the reticle alignment key 72B with the center wafer alignment target 42 and aligning the second reticle alignment key 74B with the second wafer alignment target 44.

The invention's common tgt 42 assures a precise alignment between 2 adjacent sliders 12A 12B.

Figure 6:
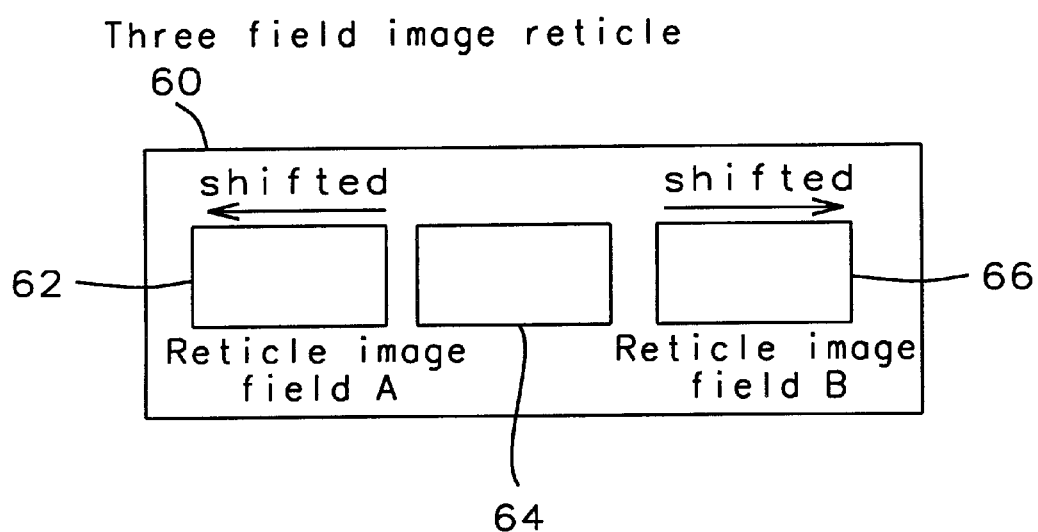
FIG. 6 is a diagram of a three field reticle of the prior art showing the shifting of the fields to form the invention's reticle 2 field image.

Standard image reticle (quartz fixture that contains the device patterns that are printed on the wafer) are composed of three separate image fields. The reticle is loaded into the stepper and is then positioned over the wafer using alignment marks on the wafer and alignment "keys" on the reticle. In the standard mode of alignment the stepper uses a single image field that is sequentially "stepped" on the wafer.
Conventional 3 Field Image Reticle FIG. 6 shows a conventional three field image reticle 60 (Quartz fixture that contains a chrome image pattern in each field). The three fields are labeled 62 64 66. The invention modifies (See the arrows ) the conventional 3 field image reticle by shifting the images to create 2 field reticle 70 of the present invention shown in FIGS. 7B & 7C.
Invention's 2 Field Reticle 70

For the invention, in order for the stepper to handle the common alignment target 42 the three field reticle (FIG. 6) must contain two image fields (See FIGS 5A 5B). FIG. 6 shows the conventional 3 field reticle and FIG. 4B shows the invention's 2 field reticle 70. The first image field 62 is shifted left from its original position on the reticle (FIG. 6) so that the left key on the reticle 60 aligns to the left (wafer) alignment target 40 (see FIG. 4B) and the right key aligns to the "common" (wafer) alignment target 42 that resides in the stitch area 28 (see FIG. 4B). The second image field 66 is shifted on the reticle in the opposite direction so that the right key on the reticle 60 aligns to the right (wafer) alignment target 44 and the left reticle key aligns to the "common" (wafer) alignment target 42 (see FIG. 4B). The field shift is necessary to accommodate the maximum key/wafer alignment system configuration of the stepper.

Note, the invention's reticle alignment keys 72A 72B/74A 74B (FIG. 4B) for image field A and image field B are in different locations within the fields A B compared to conventional alignment keys 26 27 (See FIG 2A).

Figure 7A:
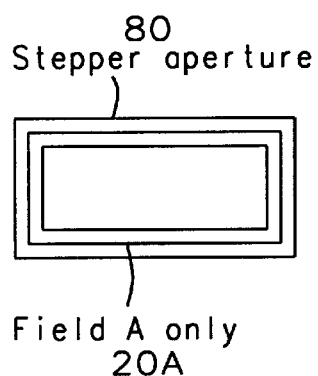
FIG. 7A is a top down view of a one field stepper aperture according to the prior art.
Figure 7B:
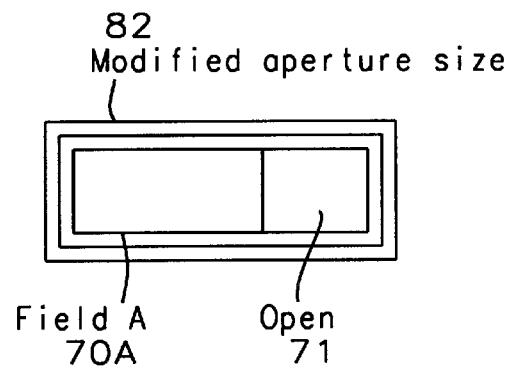
FIGS. 7B & 7C are a top down views of the invention's modified 2 field modified aperture size according to the present invention.
Figure 7C:
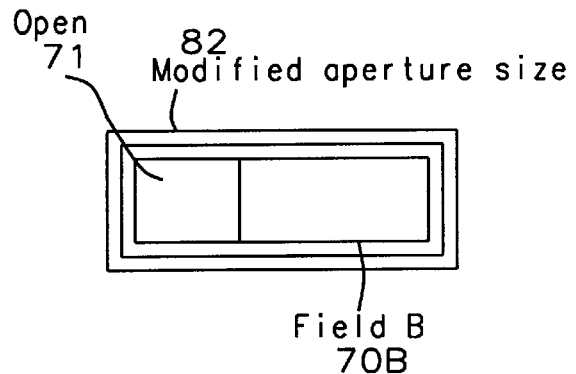

Referring to FIGS. 7A, 7B and 7C, since the fields are shifted, the stepper fixed-size aperture must be increased to handle the left and right shift of the reticle fields. FIG. 7A shows a single field aperture setting. The conventional stepper aperture has a height in a range of between about 15 mm and 16 mm; and a length in a range of between about 30 mm and 31 mm. In contrast, FIGS. 7B and 7C shows the invention's modified aperture size 82 that can contain field's A and B (70A and 70B). FIG. 7B shows field A 70A exposed with the open area 71. FIG. 7C shows field B 70B exposed with open unexposed area 71.

The invention's modified aperture size 82 preferably has a height in a range of between about 15mm and 16mm; and a length in a range of between about 33.5 mm and 34 mm.

Referring to FIG. 8, the resulting "slider bar" of (MR) devices is shown here after invention's common Alignment Target(42) method is used to step the two adjacent image fields on the wafer. All devices in the two inch row (equivalent to two adjacent stepper flash fields (e.g. 70A 70B) be lapped simultaneously to a specific height. Row lapping 36 can now be completed with higher device throat height accuracy. Little or no shift in Y-dir. occurs between image fields.

With the invention, device yield at row lap is increased by 5% to 8% because there is no discontinuity between the stepper image fields. All devices can be lapped to the same throat height.

EXAMPLES/BENEFITS

Resist box-in-box structure where the steps overlap and the right side of the image stepper field prints the outer box and the left side of the image field prints the inner box was measured using a KLA5700 CD/Overlay measurement tool. Pooled standard deviation of the Y measurement (which indicates field rotation or Y stage/alignment error) for the invention's common alignment target process on 10 wafers at 14 sites per wafer was 32 manometers one sigma. This compared to standard independent alignment target process of 30 manometers one sigma. Therefore, invention reduces the pooled standard deviation of the Y measurement by about 74% (130-32 /130).

While the invention has been particularly shown and described with reference to the preferred embodiments thereof, it will be understood by those skilled in the art that various changes in form and details may be made without departing from the spirit and scope of the invention.

What is claimed is:

1. A method of making a magnetoresistive head using a step and repeat exposure tool; comprising the steps of:
   a) providing a substrate having a slider row comprised of sliders; said slider row having a first slider area and a second slider area; said first slider area adjacent to said second slider area;
   b) forming (1) a first wafer alignment target in said first slider area; (2) a second wafer alignment target in said second slider area; and (3) a center wafer alignment target between said first and said second wafer alignment targets; said center wafer alignment target overlies both first and second slider areas;
   c) forming a photoresist layer over said substrate;
   d) using a stepper, aligning and exposing through a stepper aperture said first slider area with a first reticle image field; said first reticle image field having spaced first and second reticle alignment keys; and
      aligning said first reticle alignment key of said with said first wafer alignment target and aligning said second reticle alignment key with said center alignment target;
   e) stepping and aligning and exposing said second slider area through said stepper aperture with a second reticle image field; said second reticle image field having spaced first and second reticle alignment keys; and
      aligning said first reticle alignment key of said second reticle image field with said center wafer alignment target and aligning said second reticle alignment key of said second reticle image field with said second wafer alignment target; and
   f) forming devices in said first slider area and said second slider area.

2. The method of claim 1 which further includes:
cutting said first and second slider areas into a slider row;
lapping said slider row whereby said center wafer alignment target allows better alignment of said first and second reticle image fields thereby allowing higher throat height accuracy.

3. The method of claim 1 wherein where said stepper aperture has a modified aperture size with a height in a range of between about 15 mm and 16 mm; and a length in a range of between about 33.5 and 34 mm.

4. The method of claim 1 wherein said first wafer alignment target is located in a first corner of said first slider area away from said second slider area; and said second wafer alignment target is located is a second corner away from said first slider area; said center wafer alignment target having portions located on both first and second slider areas.

5. The method of claim 1 wherein the distance from said center wafer alignment target to said first and second wafer alignment targets is between about 23.5 and 24.5 mm.

6. A method of making a magnetoresistive (MR) head using a step and repeat exposure tool; comprising the steps of:
   a) providing a substrate having a slider row comprised of sliders; said slider row having a first slider area and a second slider area; said first slider area adjacent to said second slider area;
   b) forming (1) a first wafer alignment target in said first slider area; (2) a second wafer alignment target in said second slider area; and (3) a center wafer alignment target between said first and said second wafer alignment targets;
      (1) said first wafer alignment target is located in a first corner of said first slider area away from said second slider area; and said second wafer alignment target is located is a second corner away from said first slider area; said center wafer alignment target having portions located on both first and second slider areas;
   c) forming a photoresist layer over said substrate;
   d) using a stepper, aligning and exposing said photoresist layer through a stepper aperture in said first slider area with a first reticle image field; said first reticle image field having spaced first and second reticle alignment keys;
      aligning said first alignment key with said first wafer alignment target and aligning said second reticle alignment key with said center alignment target;
   e) stepping and aligning and exposing said photoresist layer in said second slider area through said stepper aperture with a second reticle image field; said second reticle image field having spaced first and second reticle alignment keys; and aligning said first reticle alignment key of second reticle image field with said center wafer alignment target and aligning said second reticle alignment key of said second reticle image field with said second wafer alignment target;

f) forming devices in said first slider area and said second slider area;

g) cutting said first and second slider areas into a slider row;

h) lapping said slider row whereby said center wafer alignment target allows better alignment of said first and second reticle image fields thereby allowing higher throat height accuracy.

7. The method of claim 6 wherein said stepper aperture has a modified aperture size with a height in a range of between about 15 mm and 16 mm; and a length in a range of between about 33.5 and 34 mm.

8. The method of claim 6 wherein the distance from said center wafer alignment target to said first and second wafer alignment targets is between about 23.5 and 24.5 mm.

* * * * *